United States Patent
Shen

(10) Patent No.: US 10,114,430 B2
(45) Date of Patent: Oct. 30, 2018

(54) HEAT DISSIPATION STRUCTURE FOR MOBILE DEVICE

(71) Applicant: ASIA VITAL COMPONENTS CO., LTD., New Taipei (TW)

(72) Inventor: Ching-Hang Shen, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 55 days.

(21) Appl. No.: 14/517,929

(22) Filed: Oct. 20, 2014

(65) Prior Publication Data

US 2016/0109912 A1 Apr. 21, 2016

(51) Int. Cl.
| | | |
|---|---|---|
| H05K 5/00 | (2006.01) | |
| H01L 23/38 | (2006.01) | |
| G06F 1/20 | (2006.01) | |
| G06F 1/16 | (2006.01) | |

(52) U.S. Cl.
CPC .......... *G06F 1/203* (2013.01); *G06F 1/1626* (2013.01); *H01L 23/38* (2013.01)

(58) Field of Classification Search
CPC .......... F28F 3/02; G06F 1/203; G06F 1/1626; H01L 23/38
See application file for complete search history.

(56) References Cited

U.S. PATENT DOCUMENTS

| | | | | |
|---|---|---|---|---|
| 5,953,206 A | * | 9/1999 | Jondrow | G06F 1/182 361/679.26 |
| 6,424,533 B1 | * | 7/2002 | Chu | H01L 23/38 257/930 |
| 9,244,504 B2 | * | 1/2016 | Hsieh | G06F 1/20 |
| 2008/0078186 A1 | * | 4/2008 | Cao | F25B 21/02 62/3.2 |
| 2014/0002989 A1 | * | 1/2014 | Ahuja | G06F 1/20 361/679.54 |

FOREIGN PATENT DOCUMENTS

| | | |
|---|---|---|
| CN | 2515800 Y | 10/2002 |
| CN | 201293238 Y | 8/2009 |
| CN | 203722977 U | 7/2014 |
| CN | 203759637 U | 8/2014 |
| TW | M474954 U | 3/2014 |
| TW | M476296 U | 4/2014 |

* cited by examiner

*Primary Examiner* — Robert J Hoffberg
*Assistant Examiner* — Hung Dang
(74) *Attorney, Agent, or Firm* — C. G. Mersereau; Nikolai & Mersereau, P.A.

(57) ABSTRACT

A heat dissipation structure for mobile device includes an element holding member, which has a holding portion and a cooling chip set on the holding portion. The holding portion has a first side and an opposite second side; and the cooling chip has a cold surface and an opposite hot surface. The cooling chip is set on the holding portion with the cold surface and the hot surface being flush with the first and the second side of the holding portion, respectively. The heat dissipation structure can be mounted in a mobile device to quickly cool heat-producing electronic elements in the mobile device, so that any produced heat is guided away from the mobile device without accumulating therein.

2 Claims, 5 Drawing Sheets

HEAT DISSIPATION STRUCTURE FOR MOBILE DEVICE

FIELD OF THE INVENTION

The present invention relates to a heat dissipation structure for mobile device, and more particularly to a mobile device's heat dissipation structure that includes a cooling module for cooling an interior of the mobile device and enables enhanced heat dissipation efficiency of the mobile device.

BACKGROUND OF THE INVENTION

Most of the currently available mobile devices, such as notebook computers, tablet computers and smartphones, have a slim body and a largely increased computing speed. The electronic elements in the mobile devices for executing the computation at high speed also produce a large amount of heat during operation thereof. For the purpose of being conveniently portable, the mobile devices have a largely reduced overall thickness. And, to prevent invasion by foreign matters and moisture, the mobile devices are provided with only an earphone port and some necessary connection ports but not other open holes that allow air convection between the narrow internal space of the mobile devices and the external environment. Therefore, due to the small thickness of the mobile devices, the large amount of heat produced by the electronic elements in the mobile devices, such as the computation executing units and the battery, can not be quickly dissipated into the external environment. Further, due to the closed narrow internal space of the mobile devices, it is difficult for the heat produced by the electronic elements to dissipate through air convection. As a result, heat tends to accumulate or gather in the mobile devices to adversely affect the working efficiency or even cause crash of the mobile devices.

To solve the above problems, some passive type heat dissipation elements, such as heat spreader, vapor chamber, heat sink, etc., are mounted in the mobile devices to assist in heat dissipation thereof. Due to the small thickness and the narrow internal space of the mobile devices, these passive type heat dissipation elements must also be extremely thin to be mounted in the very limited internal space of the mobile devices. However, the wick structure and the vapor passage in the size reduced heat spreader and vapor chamber are also reduced in size to result in largely lowered heat transfer efficiency of the heat spreader and the vapor chamber and accordingly, poor heat dissipation performance thereof. In brief, when the internal computing units of the mobile devices have an extremely high power, the conventional heat spreader and vapor chambers just could not effectively dissipate the heat produced by the high power computing units.

SUMMARY OF THE INVENTION

A primary object of the present invention is to provide a heat dissipation structure for mobile device to overcome the drawbacks of the prior art. To achieve the above and other objects, the heat dissipation structure for mobile device according to the present invention includes an element holding member.

The element holding member includes a holding portion and a cooling chip set on the holding portion. The holding portion has a first side and an opposite second side, and the cooling chip has a cold surface and an opposite hot surface. The cooling chip is set on the holding portion with the cold surface and the hot surface being flush with the first side and the second side of the holding portion, respectively.

The heat dissipation structure of the present invention can be mounted in a mobile device to quickly cool heat-producing electronic elements in the mobile device, preventing any produced heat from accumulating in the mobile device to thereby give the latter to an upgraded overall heat dissipation performance.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
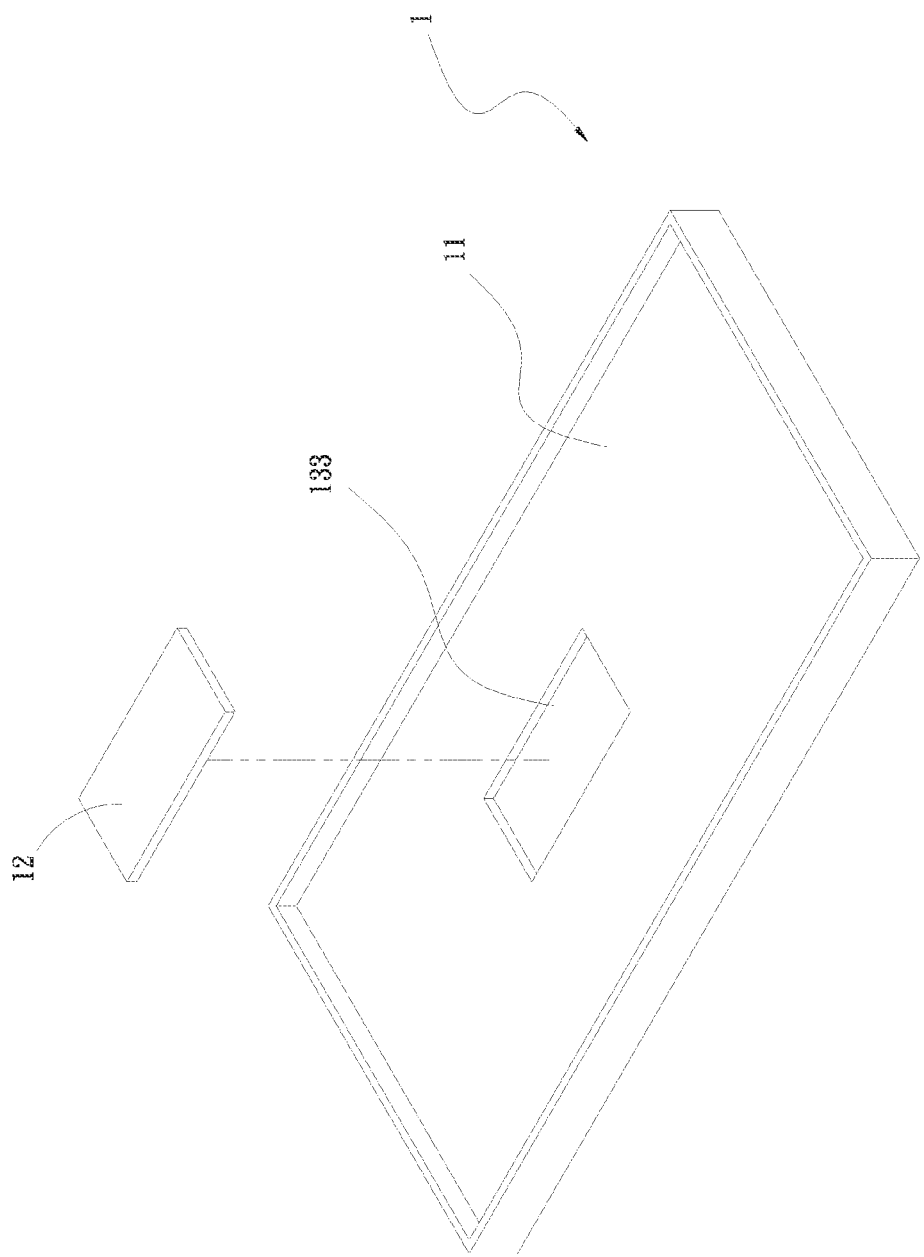
FIG. 1 is an exploded perspective view of a heat dissipation structure for mobile device according to a first embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 2:
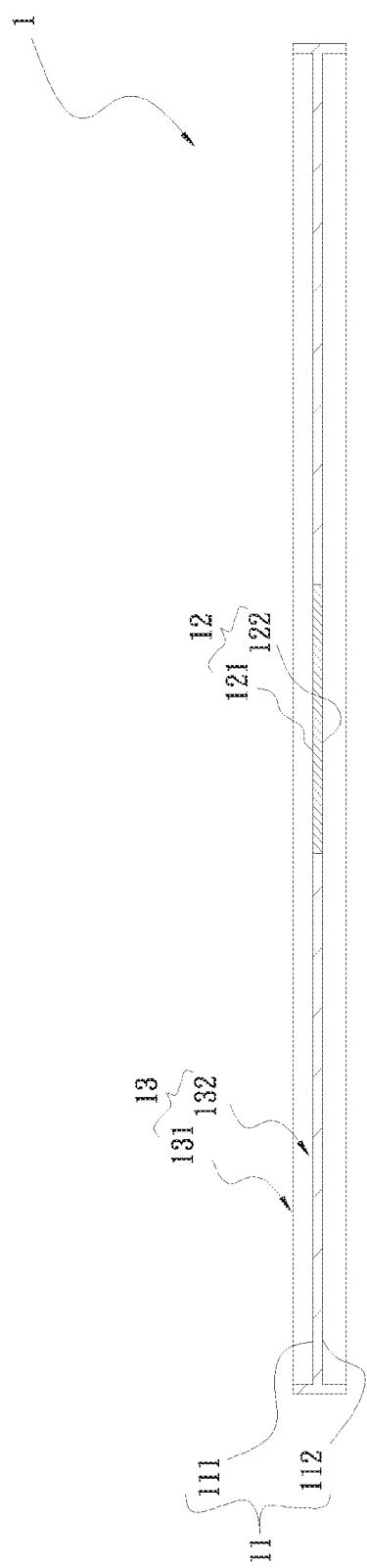
FIG. 2 is an assembled sectional view of the heat dissipation structure for mobile device according to the first embodiment of the present invention.

Please refer to FIGS. 1 and 2 that are exploded perspective and assembled sectional views, respectively, of a heat dissipation structure for mobile device according to a first embodiment of the present invention. As shown, the heat dissipation structure for mobile device includes an element holding member 1.

The element holding member 1 includes a holding portion 11 and a cooling chip 12 set on the holding portion 11. The holding portion 11 has a first side 111 and an opposite second side 112. The cooling chip 12 has a cold surface 121 and an opposite hot surface 122. The cooling chip 12 is set on the holding portion 11 with the cold surface 121 and the hot surface 122 being flush with the first side 111 and the second side 112, respectively.

The element holding member 1 further includes a receiving space 13, which has an open side 131 and an opposite closed side 132. The holding portion 11 is provided on the closed side 132 of the receiving space 13 of the element holding member 1. The closed side 132 of the receiving space 13 is formed with a through hole 133, in which the cooling chip 12 is set, such that the cold surface 121 and the hot surface 122 of the cooling chip 12 are flush with the first side 111 and the second 112 of the holding portion 11, respectively.

The element holding member 1 can be formed of an aluminum sheet, an aluminum copper alloy sheet, a stainless steel sheet, a sheet molded by way of powder metallurgy, or a sheet molded by way of plastic injection molding.

Figure 3:
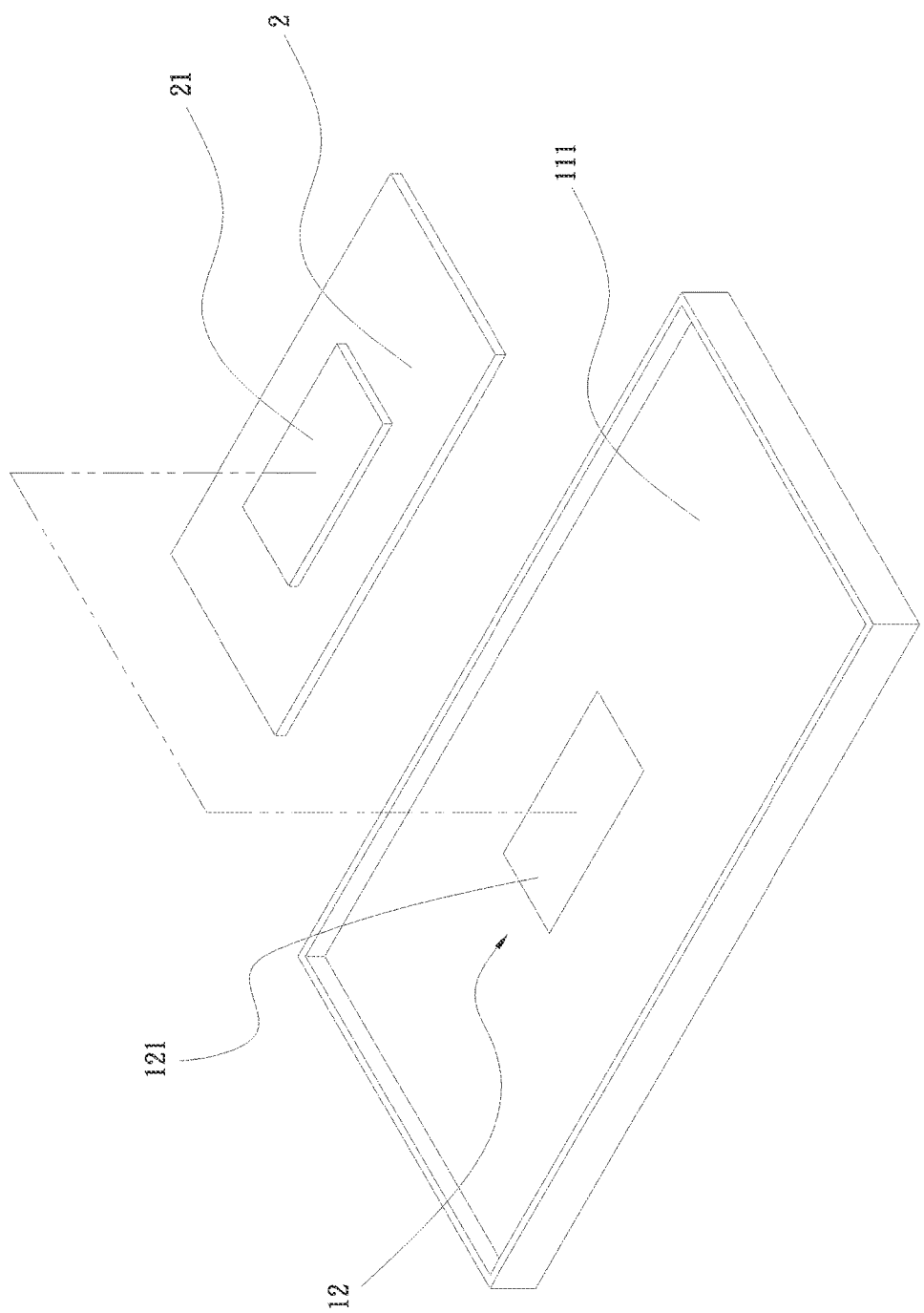
FIG. 3 is an exploded perspective view of a heat dissipation structure for mobile device according to a second embodiment of the present invention.
Figure 4:
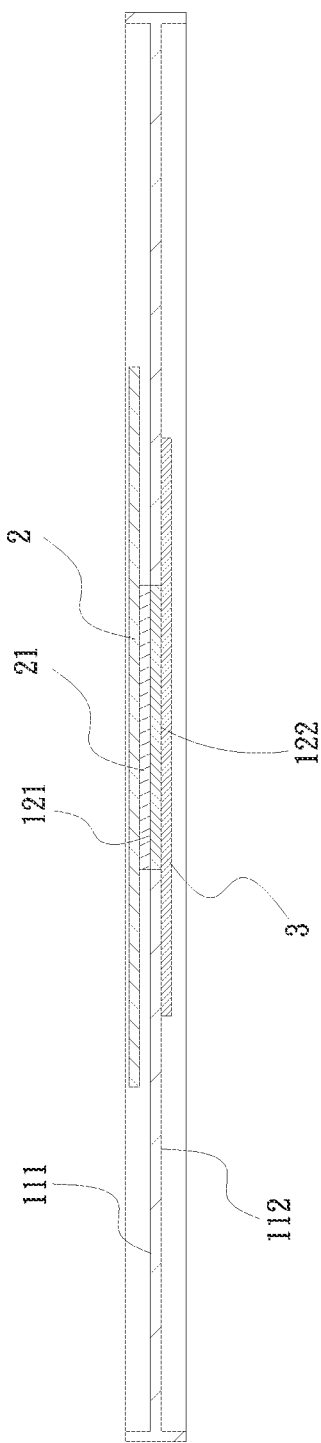
FIG. 4 is an assembled sectional view of the heat dissipation structure for mobile device according to the second embodiment of the present invention.

FIGS. 3 and 4 are exploded perspective and assembled sectional views, respectively, of a heat dissipation structure for mobile device according to a second embodiment of the present invention. As shown, the second embodiment is generally structurally similar to the first embodiment, except that there are a plurality of electronic elements 2 held to the first side 111 of the holding portion 11 and at least one heat dissipation element 3 held to the second side 112 of the holding portion 11. The electronic elements 2 include at least one heat source 21, which is attached to or located adjacent to the cold surface 121 of the cooling chip 12. The electronic elements 2 can be any of a circuit board, a transistor, a flash memory or a central processing unit (CPU). By attaching the heat source 21 to the cold surface 121 of the cooling chip 12, the cold surface 121 of the cooling chip 12 functions to cooling the heat source 21 of the electronic elements 2.

The heat dissipation element 3 held to the second side 112 of the holding portion 11 can be a copper thin sheet, a vapor chamber, a heat pipe, or a piece of graphite or graphene. The heat dissipation element 3 is attached to the hot surface 122 of the cooling chip 12 to be flush with the second side 112 of the holding portion 11. Heat produced by the hot surface 122 of the cooling chip 12 can be transferred via the heat dissipation element 3 to other areas of the element holding member 1 for the heat to uniformly dissipate from the element holding member into ambient air.

Figure 5:
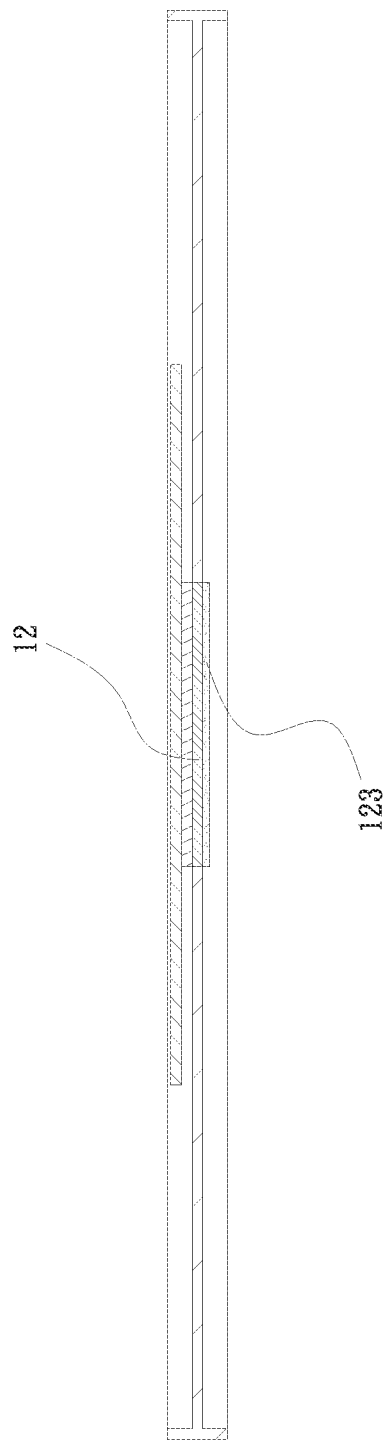
FIG. 5 is an assembled sectional view of a heat dissipation structure for mobile device according to a third embodiment of the present invention.

FIG. 5 is an assembled sectional view of a heat dissipation structure for mobile device according to a third embodiment of the present invention. As shown, the third embodiment is generally structurally similar to the second embodiment, except that, in the third embodiment, the hot surface of the cooling chip 12 has a heat dissipation layer 123 formed thereon. With the heat dissipation layer 123, the heat dissipation structure for mobile device according to the present invention can have further increased heat dissipation efficiency through heat radiation.

The heat dissipation layer 123 is formed on the hot surface of the cooling chip 12 through micro arc oxidation (MAO) process, plasma electrolytic oxidation (PEO) process, anodic spark deposition (ASD) process, or anodic oxidation by spark deposition (ANOF) process.

The heat dissipation layer 123 is a porous structure, a nanostructure, a high-radiation ceramic structure or a high-rigidity ceramic structure, and preferably has a black color, a matt black color, or any dark color.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation structure for a mobile device, comprising:
   an element holding member including an element holding portion and a cooling module set in the element holding portion; the element holding portion having a first side and an opposite second side, and the cooling module being a unitary structure having a cold surface and an opposite hot surface; and the cooling module being set in the element holding portion with the cold surface and the hot surface being flush with the first side and the second side, respectively;
   wherein the first side of the element holding portion has a plurality of electronic elements disposed thereon in the element holding member; and the electronic elements including at least one heat source; and the heat source being attached to or located abutting the cold surface of the cooling module;
   wherein the second side of the element holding portion has at least one heat dissipation element held thereto; the at least one heat dissipation element being attached to or located abutting the hot surface of the cooling module; and the heat dissipation element being selected from a group consisting of a copper sheet, a vapor chamber, a heat pipe, a piece of graphite, and a piece of graphene; and
   wherein the element holding member further includes a plurality of receiving spaces, which each of the receiving spaces has an open side and an opposite closed side, the electronic elements disposed in a first one of the receiving spaces on the first side of the element holding portion, and the at least one heat dissipation element disposed in a second one of the receiving spaces on the second side of the element holding portion.

2. The heat dissipation structure for the mobile device as claimed in claim 1, wherein the element holding portion is selected from a group consisting of an aluminum sheet, an aluminum copper alloy sheet, a stainless steel sheet, a sheet molded by way of powder metallurgy, and a sheet molded by way of plastic injection molding.

* * * * *